(12) United States Patent
Lenz

(10) Patent No.: US 11,150,682 B2
(45) Date of Patent: Oct. 19, 2021

(54) CURRENT GENERATION DEVICE

(71) Applicant: STMICROELECTRONICS (TOURS) SAS, Tours (FR)

(72) Inventor: Kuno Lenz, Voreppe (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 17/085,493

(22) Filed: Oct. 30, 2020

(65) Prior Publication Data

US 2021/0149430 A1    May 20, 2021

(30) Foreign Application Priority Data

Nov. 14, 2019   (FR) ..................................... 1912716

(51) Int. Cl.
*G05F 3/26*    (2006.01)
*G05F 1/56*    (2006.01)

(52) U.S. Cl.
CPC ............... *G05F 3/262* (2013.01); *G05F 1/56* (2013.01)

(58) Field of Classification Search
None
See application file for complete search history.

(56) References Cited

U.S. PATENT DOCUMENTS

| 5,654,629 | A * | 8/1997 | Theus | ..................... G05F 3/262 323/316 |
| 6,583,611 | B2 * | 6/2003 | Serratoni | ................ G05F 3/245 323/313 |
| 6,788,134 | B2 * | 9/2004 | Secareanu | ............... G05F 3/262 323/315 |
| 6,956,397 | B2 * | 10/2005 | Lim | ......................... G01K 7/01 323/907 |
| 7,589,580 | B2 * | 9/2009 | Lee | ............................ G05F 3/30 327/513 |
| 8,766,611 | B2 * | 7/2014 | Hu | .......................... G05F 1/561 323/281 |
| 9,766,646 | B2 * | 9/2017 | Ide | .......................... G05F 3/262 |
| 2010/0052645 | A1 | 3/2010 | Huang et al. | |
| 2018/0041195 | A1 | 2/2018 | Tsai | |

* cited by examiner

*Primary Examiner* — Thomas J. Hiltunen
(74) *Attorney, Agent, or Firm* — Slater Matsil, LLP

(57) ABSTRACT

In an embodiment, a device for generating a first current from a second current, comprises: an output transistor configured to generate the first current; a first circuit configured to generate a third current representative of the second current and to draw it from a first node; a second circuit configured to generate a fourth current representative of the first current and to supply it to the first node; and a third circuit receiving a fifth current representative of a difference between the third and fourth currents, the third circuit being configured to generate a sixth current representative of the fifth current and to draw it from a control terminal of the output transistor.

21 Claims, 2 Drawing Sheets

CURRENT GENERATION DEVICE

CROSS-REFERENCE TO RELATED APPLICATIONS

This application claims the benefit of French Patent Application No. 1912716, filed on Nov. 14, 2019, which application is hereby incorporated herein by reference.

TECHNICAL FIELD

The present disclosure generally concerns electronic circuits, and, in particular embodiments, to a current generation device.

BACKGROUND

Devices for generating a first current from a second current having a controlled value, smaller than that of the first current, are known, the first current then corresponding to the second current multiplied by a positive factor greater than 1. Such devices are for example used as circuits for driving a metal-oxide-semiconductor (MOS) power transistor, the first current then enabling to charge or discharge the gate of the power transistor.

SUMMARY

Some embodiments relate to an integrated circuit.

Some embodiments related to a device for generating a current from another current.

Some embodiments relate to generating a first current from a second current. In some embodiments, the second current has a controlled value, smaller than that of the first current.

An embodiment provides a device for generating a first current from a second current wherein, as compared with known devices, a duration between a change of value of the second current and a corresponding change of value of the first current is decreased, particularly when the second current has a controlled value, smaller than that of the first current.

An embodiment provides a device for generating a first current from a second current wherein, as compared with known devices, the value of the first current is less sensitive to a variation of a reference potential, or virtual ground, of the device, in particular when the second current has a controlled value, smaller than that of the first current.

An embodiment provides a device for generating a first current from a second current, the device comprising:

an output transistor configured to generate the first current;

a first circuit configured to generate a third current representative of the second current and to draw the third current from a first node of the device;

a second circuit configured to generate a fourth current representative of the first current flowing through the output transistor and to supply the fourth current to the first node; and a third circuit connected to the first node to receive a fifth current representative of a difference between the third and fourth currents, the third circuit being configured to generate a sixth current representative of the fifth current and to draw the sixth current from a control terminal of the output transistor.

According to an embodiment, the device is configured so that the first current is equal to j times the second current, j being greater than or equal to 25, for example, greater than or equal to 50, preferably greater than or equal to 100.

According to an embodiment, the third circuit is configured so that the sixth current is equal to k times the fifth current, k being in the range from 10 to 20.

According to an embodiment, the device is configured so that a variation of the second current causes a corresponding variation of the third and fourth currents, and so that the variation of the third current is faster than the variation of the fourth current.

According to an embodiment, a current mirror of the first circuit comprises a first branch coupled to a second node configured to receive the second current, and a second branch connected to the first node and configured to draw the third current from the first node.

According to an embodiment, the first circuit is further configured to supply a seventh current to the control terminal of the output transistor, the seventh current being determined by the second current.

According to an Embodiment:

a first transistor of the first circuit comprises a first conduction terminal connected to the control terminal of the output transistor and disconnected from the first node; and a second transistor of the first circuit comprises a first conduction terminal connected to the first branch of the current mirror of the first circuit, and a second conduction terminal and a control terminal connected to the second node and to a control terminal of the first transistor.

According to an Embodiment:

a first transistor of the second circuit comprises a control terminal connected to the control terminal of the output transistor; and a current mirror of the second circuit comprises a first branch connected to a first conduction terminal of the first transistor of the second circuit and a second branch connected to the first node.

According to an embodiment, a current mirror of the third circuit comprises a first branch connected to the first node and configured to receive the fifth current, and a second branch connected to the control terminal of the output transistor and configured to draw the sixth current from the control terminal of the output transistor.

According to an embodiment, the first, second, third, and fourth currents are all positive or all negative.

According to an embodiment, the device further comprising a current source configured to supply the second current.

According to an embodiment, each of the first and second circuits is connected between a node configured to receive a first potential, and a node configured to receive a second potential, the third circuit being connected to the node configured to receive the second potential, and the output transistor having a conduction terminal connected to the node configured to receive the second potential.

According to an embodiment, the current source is connected between the node configured to receive the first potential and the first circuit.

According to an embodiment, the first potential is greater than the second potential.

According to an embodiment, the second potential is a reference potential of the device.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
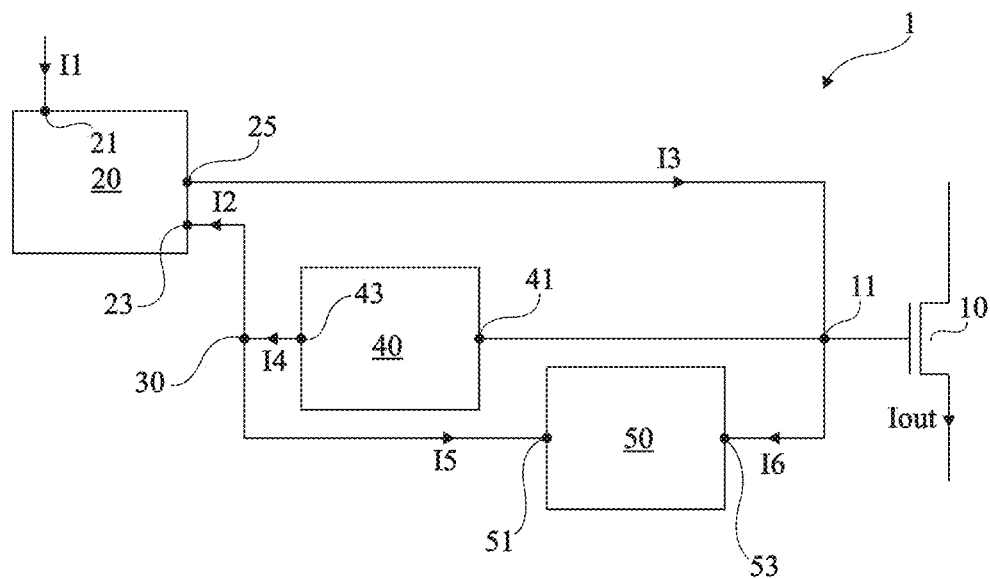
FIG. 1 schematically shows in the form of blocks an embodiment of a device for generating a first current from a second current.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, usual electronic circuits comprising a device for generating a first current from a second current have not been detailed, the described embodiments being compatible with such usual electronic circuits.

Throughout the present disclosure, the term "connected" is used to designate a direct electrical connection between circuit elements, whereas the term "coupled" is used to designate an electrical connection between circuit elements that may be direct, or may be via one or more other elements.

In the following description, when reference is made to terms qualifying absolute positions, such as terms "front," "back," "top," "bottom," "left," "right," etc., or relative positions, such as terms "above," "under," "upper," "lower," etc., or to terms qualifying directions, such as terms "horizontal," "vertical," etc., unless otherwise specified, it is referred to the orientation of the drawings.

The terms "about," "approximately," "substantially," and "in the order of," are used herein to designate a tolerance of plus or minus 10%, preferably of plus or minus 5%, of the value in question.

In the following description, it is considered, unless otherwise specified, that a current is lower than another current when the absolute value of this given current is smaller than the absolute value of the other current.

Further, in the following description, it is considered, unless otherwise specified, that a given current is a multiple of another current when the given current is equal to the product of the other current by a positive factor.

Further, in the following description, it is considered that a positive or negative current is supplied to a node, a circuit, or a terminal, or received by a node, a circuit, or a terminal when the current flows towards this node, this circuit, or this terminal and, conversely, that the current is drawn from a node, a circuit, or a terminal when the current flows from this node, this circuit, or this terminal. A current is said to be generated by a circuit when this current is supplied to a node or a terminal by the circuit or drawn from this node or this terminal by the circuit.

FIG. 1 schematically shows in the form of blocks an embodiment of a device 1 for generating a current Iout from a current I1 than current Iout. In other words, device 1 is configured to generate current Iout from current I1 so that current Iout is a multiple of current I1, and more particularly so that current Iout is equal to j times current I1, j being greater than 1. Preferably, j is greater than or equal to 25, for example, greater than or equal to 50, or even greater than or equal to 100.

In the following description, current I1 is a current having a controlled value, that is, a current having its value modified by using a control signal (not illustrated).

Device 1 comprises an output transistor 10 configured to generate current Iout. In other words, transistor 10 is controlled so that current Iout flows between its conduction terminals. As an example, transistor 10 is a MOS transistor.

In this example, currents Iin and Iout are positive and transistor 10 is an NMOS transistor, current Iout flowing from the drain (at the top of FIG. 1) to the source (at the bottom of FIG. 1) of transistor 10.

Device 1 comprises a circuit 20 configured to generate a current I2 from current I1 and to draw current I2 from a node 30 of device 1. Circuit 20 comprises an input 21 configured to receive current I1. Circuit 20 comprises an output 23 connected to node 30, current I2 flowing from node 30 to output 23.

Circuit 20 is more particularly configured to generate a current I2 representative of current I1. For example, circuit 20 is configured so that current I2 is a multiple of current I1, preferably so that current I1 and I2 are equal.

In this example where current I1 is positive, current I2 is also positive.

Circuit 20 is further configured to supply a current I3 to the control terminal 11 of transistor 10, that is, to gate 11 of transistor 10 when the latter is a MOS transistor. Circuit 20 comprises an output 25 connected to terminal 11 of transistor 10, output 25 being configured to supply current I3 to terminal 11. Current I3 is determined by current I1. More particularly, circuit 20 is configured so that, at least when the value of current I1 is stable or constant (static or steady state), the current Iout flowing through transistor 10 is equal to j times current I1. In other words, circuit 20 is configured to impose, at least in steady state, a control potential on terminal n of transistor 10, having its value determined by the value of current I1, so that the current Iout flowing through transistor 10 is equal to j times current I1.

Device 1 comprises a circuit 40 configured to generate a current I4 representative of current Iout flowing through transistor 10 and to supply current I4 to node 30. Circuit 40 comprises an input 41 connected to terminal 11 of transistor 10, input 41 being for example configured to receive the potential of terminal 11. Circuit 40 comprises an output 43 connected to node 30, output 43 being configured to supply current I4 to node 30.

Circuit 40 is more particularly configured to generate the current I4 from the potential on terminal 11 of transistor 10, preferably without drawing or supplying current from or to terminal 11. In other words, the value of current I4 is determined by the value of the potential on terminal 11 of transistor 10.

As an example, circuit 40 is configured so that current I4 is a multiple of current Iout. Preferably, current I4 is lower than current Iout. Preferably, current I4 is at least 10 times lower, for example at least 50 times lower, or even at least 100 times lower than current Iout. Further, preferably, current I4 is lower than 2 times current I1.

In the present example where current Iout is positive, current I4 is also positive.

Device 1 comprises a circuit 50 connected to node 30 to receive a current I5 equal to a difference between currents I2 and I4. More exactly, circuit 50 is configured to receive current I5 equal to current I4 delivered to node 30 minus current I2 drawn from node 30. Circuit 50 has an input 51 connected to node 30, input 51 being configured to receive current I5.

Circuit 50 is further configured to generate a current I6 from current I5, and to draw current I6 from terminal 11 of transistor 10. Circuit 50 has an output 53 connected to terminal 11, output 53 being configured to draw current I6 from terminal 11. Current I6 is a multiple of current I5. Preferably, current I6 is equal to k times current I5, k being greater than 1, for example, in the range from 10 to 20.

In device 1, transistor 10 comprises a stray capacitance between its control terminal and each of its conduction terminals.

In steady state, current I1 is constant, whereby current I2 is constant. Further, current Iout is constant, whereby current I4 is constant. Due to the fact that currents I2 and I4 are constant, current I5 is constant, whereby current I6 is also constant.

Further, in steady state, the value of current I1 imposes the potential of terminal 11 of transistor 10, via circuit 20 and, more particularly, via the potential on output 25 of circuit 20. The potential difference across each of the stray capacitances of transistor 10 is then constant and such that current Iout is equal to j times current I1. Due to the fact that no current is drawn from or supplied to terminal 11 by circuit 40 or transistor 10, current I3 is then equal to current I6.

To illustrate the operation of device 1 in dynamic state, the case where the value of current I1 decreases, in absolute value, is considered as an example.

As a consequence of such a decrease of current I1, circuit 20 tends to decrease the potential on terminal 11 of transistor 10, so that current Iout decreases at the same time as current I1. However, due to the fact that transistor 10 comprises stray capacitances between its conduction terminals and its terminal 11, potential on terminal 11 decreases with a delay relative to the decrease of current I1, whereby current Iout decreases with a delay relative to the decrease of current I1. Meanwhile, current I2 decreases, following the decrease of current I1, with a shorter delay than that with which current Iout follows the decrease of current I1. Since current Tout, and thus current I4, decreases slower than current I2, current I5 increases, whereby current I6 also increases. The increase of current I6 drawn from terminal 11 of transistor 10 enables to accelerate the discharge of the stray capacitances of transistor 10, and thus the decrease of the potential of terminal 11, and thus the decrease of current Iout.

The operation of device 1 in dynamic state due to an increase of current I1 can be deduced from the above-described operation, in particular, an increase of current I1 results in a decrease of current I6 drawn from terminal 11, whereby the current charging the stray capacitances of transistor 10 increases, and thus the potential of terminal 11 increases, causing an increase of current Iout.

Thus, in device 1, the provision of current I6 enables to accelerate the speed at which the stray capacitances of transistor 10 charge and discharge, respectively as a consequence of an increase and of a decrease of current I1, with respect to a device where current I6 would not be drawn from terminal 11 or transistor 10. In other words, device 1 enables a modification of current I1 to cause a corresponding modification of current Iout faster than in a device where current I6 would not be drawn from terminal 11.

In some embodiments, the operation of device 1 results from current I4 being representative of current Iout, current I2 being representative of current I1, current I2 varying faster than current Iout after a variation of current I1, and the current I6 drawn from terminal 11 corresponding to a multiple of current I5, which itself corresponds to the difference between currents I4 and I2.

Figure 2:
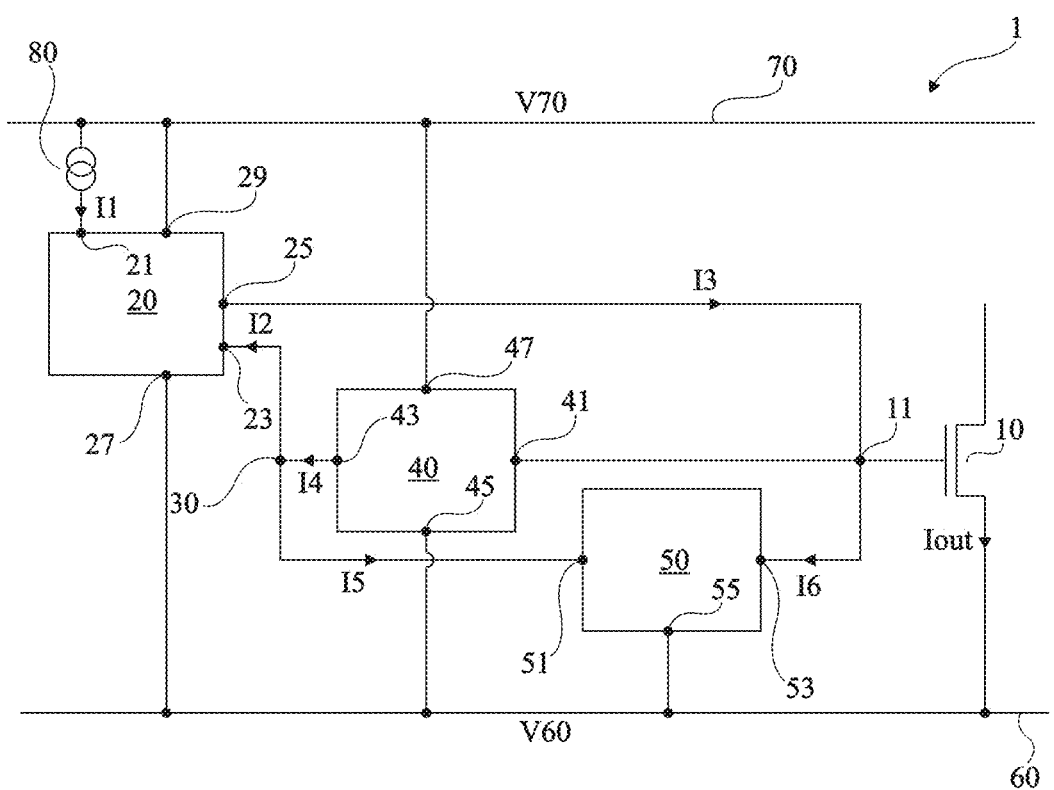
FIG. 2 schematically shows in the form of blocks a more detailed embodiment of the device of FIG. 1.

FIG. 2 schematically shows in the form of blocks a more detailed embodiment of device 1. Only the differences between devices 1 of FIGS. 1 and 2 are here highlighted.

In FIG. 2, as compared with FIG. 1, the way in which circuits 20, 40, and 50 are connected to two electric conductors, nodes or rails, respectively 60 and 70, to be powered, has further been shown. Rails 60 and 70 are configured to receive two different potentials, respectively V60 and V70, one of the two potentials playing the role of a power supply potential for device 1, the other one of the two potentials playing the role of a reference potential for device 1.

In the shown embodiment, potential V60 of rail 60 (at the bottom of FIG. 2) forms the reference potential of device 1. Further, potential V70 of rail 70 (at the top of FIG. 2) forms the power supply potential of device 1. Potential V70 is then greater than potential V60.

Transistor 10 has a conduction terminal, in the present example, its source, coupled, preferably connected, to rail 60.

According to an embodiment, when current Iout is supplied to the gate of a MOS transistor (not shown), for example, an NMOS transistor for example controlling an active load such as a motor (e.g., such as a brushless DC motor), rail 60 is coupled, preferably connected, to the gate of the MOS transistor. The conduction terminal of transistor 10 which is not connected to rail 60 is then for example connected to rail 70 (at the top of FIG. 2).

According to an alternative embodiment, when current Iout is drawn from the gate of a MOS transistor (not shown), for example, an NMOS transistor for example controlling an active load such as a motor, rail 60 is coupled, preferably connected, to the source of this MOS transistor. The conduction terminal of transistor 10 which is not connected to rail 60 is then for example connected to the gate of this MOS transistor.

In this embodiment, each of circuits 20, 40, and 50 is connected to rail 60. For example, circuits 20, 40, and 50 comprise an input, respectively 27, 45, and 55 connected to rail 60 to receive reference potential V60.

In this embodiment, each of circuits 20 and 40 is further connected to rail 70. For example, circuits 20 and 40 comprise a input, respectively 29 and 47, connected to rail 70 to receive power supply potential V70.

In this embodiment, circuit 50 is powered by the potential on terminal 11 of transistor 10, via its input 53.

When potential V60 varies, the potential difference between the gate and the source of transistor 10 varies correspondingly. As a result, even if the value of current I1 is constant, the value of current Iout may be modified and no longer correspond to the expected value determined by the value of current I1. However, since current I1 is not modified, current I2 is not modified either. Further, current I4 follows the change of value of current Iout. This results in a variation of current I5, and thus of current I6, which enables to charge or to discharge the gate of transistor 10 so that current Iout recovers the expected value determined by current I1. Particularly, current Iout recovers this expected value determined by current I1 faster than in known devices that allow to generate a current Iout the value of which being determined by a current I1.

Thus, device 1 enables to maintain current Iout at a value determined by the value of current I1, even when reference potential V60 exhibits variations of its value. This would not be the case if current I6 was not drawn from terminal 11.

FIG. 2 show a current source 80 configured to supply current I1 to circuit 20, and more particularly to input 21 of circuit 20. Current source 80 is controlled by a control signal, not illustrated, the state or the value of the control signal determining the value of current I1 supplied by current source 80, and thus the value of current Iout.

In this embodiment, current source 80 is connected between circuit 20 and rail 70 and, more exactly, between input 21 or circuit 20 and rail 70.

According to an embodiment, current source 80 forms part of device 1.

According to an alternative embodiment, current source 80 is external to device 1.

Figure 3:
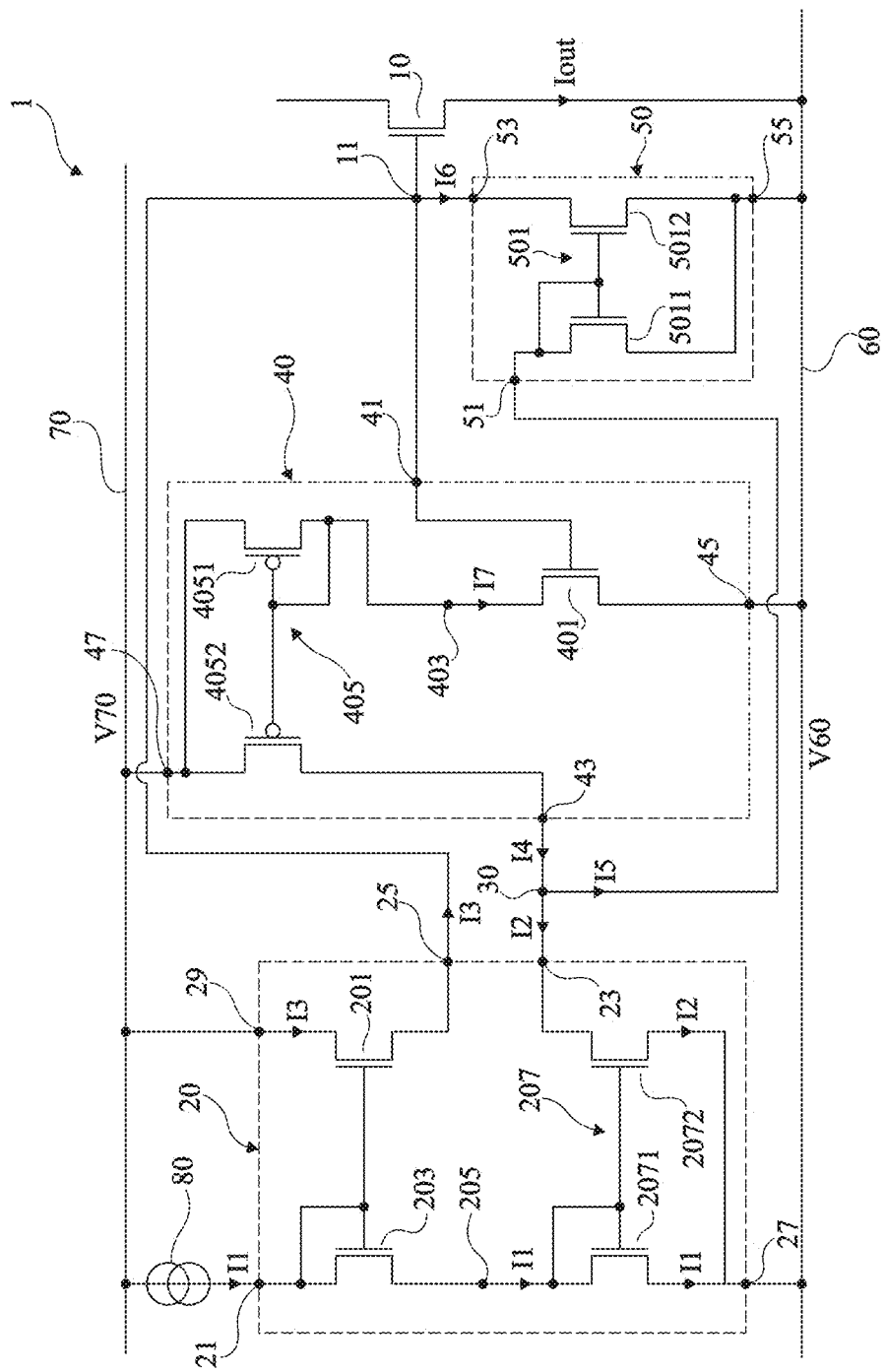
FIG. 3 shows in the form of a circuit a still more detailed embodiment of the device of FIG. 1.

FIG. 3 shows, in the form of circuits, a still more detailed embodiment of the device 1 of FIGS. 1 and 2. Only the differences between devices 1 of FIGS. 2 and 3 are here highlighted. In FIG. 3, circuits 20, 40, and 50 are shown in dotted lines.

According to an embodiment, circuit 20 comprises a transistor 201 and a transistor 203, for example, MOS transistors, for example, NMOS transistors in this example where current I1 and current I3 are positive.

Transistor 201 comprises a conduction terminal, in the present example, its source, connected to output 25 of circuit 20 or, in other words, to terminal 11 of transistor 10.

The other conduction terminal of transistor 201, in the present example, its drain, is here connected to input 29 of circuit 20 or, in other words, to rail 70.

Transistor 203 comprises a conduction terminal, in the present example its drain, connected to the input or node 21 of circuit 20 to receive current I1. The other conduction terminal of transistor 203, in the present example, its source, is coupled to rail 60. More particularly, as shown in FIG. 3, this other conduction terminal of transistor 203 is connected to a node 205 coupled to rail 60.

Further, the control terminal of transistor 203 is connected to input 21 of circuit 20, and to the control terminal of transistor 201.

In operation, current I1 flows between the conduction terminals of transistor 203, from rail 70 to rail 60, and current I3 flows between the conduction terminals of transistor 201, from rail 70 to output 25, or, in other words, to terminal 11 of transistor 10. Current I1 or, in other words, current source 80, imposes the potential on the control terminal of transistor 203, and thus on the control terminal of transistor 201. Current I1 thus determines current I3 or, in other words, the potential of output 25 of circuit 20, and thus of terminal 11 of transistor 10.

Preferably, transistors 201 and 203 are identical or, in other words, each have a same W/L ratio, L being the gate length of the transistor and W the gate width of the transistor. In this case, in static or permanent mode, current I3 is equal to current I1.

According to an embodiment, circuit 20 comprises a current mirror 207. A first branch of current mirror 207 (on the left-hand side of FIG. 3) is coupled to node 205 configured to receive current I1, so that the first branch of the current mirror receives current I1. A second branch of the current mirror (on the left-hand side of FIG. 3) is connected to output 23 of circuit 20 or, in other words, to node 30, to draw current I2 from node 30. Current mirror 207 is configured so that current I2 is representative of current I1, for example, so that current I2 is a multiple of current I1, preferably equal to current I1.

In operation, current I1 flows in the first branch of current mirror 207 from node 205, current I2 flowing through the second branch of the current mirror from node 30.

In the embodiment illustrated in FIG. 3, the first branch of current mirror 207 is connected between node 205 and node 27 of circuit 20 or, in other words, the first branch of current mirror 207 couples node 205 to rail 60. Further, the second branch of current mirror 207 is connected between nodes 23 and 27 of circuit 20 or, in other words, between node 30 and rail 60. Still in other words, the second branch of the current mirror couples node 30 to rail 60.

As an example, as shown in FIG. 3, the first and second branches of current mirror 207 each comprise a transistor, respectively 2071 and 2072. As an example, transistors 2071 and 2072 are MOS transistors, for example, NMOS transistors in the present example where currents I1 and I2 are positive. NMOS transistor 2071 has a conduction terminal, in the present example, its drain, connected to node 205, NMOS transistor 2072 has a conduction terminal, in the present example, its drain, connected to node 30, the other conduction terminal, in the present example, the source, of each of transistors 2071 and 2072 being connected to rail 60. Further, the control terminal of transistor 2071 is connected to node 205 and to the control terminal of transistor 2072. Preferably, transistors 2071 and 2072 are identical or, in other words, have the same W/L ratio, currents I1 and I2 being then equal.

In circuit 20, when a modification of current I1 causes a corresponding modification of current I2 and a corresponding modification of current I3 or, in other words, of the potential on output 25 of the circuit, the modification of current I2 follows the modification of current I1 faster or, in other words, with a shorter delay, than the modification of the potential of output 25. This results from the fact that output 25 is connected to the stray capacitances of MOS transistor 10, which slow the modifications of the potential of output 25, while output 23 is connected to node 30 which is uncoupled from terminal 11. Further, the possible capacitances (stray or intrinsic) present on node 30 have smaller values than those of MOS transistor 10.

According to an embodiment, circuit 40 comprises a transistor 401, for example, a MOS transistor, for example, an NMOS transistor in the present example where current I4 is positive. Transistor 401 comprises a control terminal connected to terminal 11 of transistor 10. Further, transistor 401 comprises a conduction terminal, in the present example, its source, connected to a same conduction terminal, in the present example the source, of transistor 10. In other words, this conduction terminal of transistor 401 is connected to the node 45 of circuit 40, and thus to the rail 60 having the same conduction terminal of transistor 10 connected thereto. The other conduction terminal of transistor 401, in the present example, its drain, is coupled to rail 70. For example, this other conduction terminal of transistor 401 is connected to a node 403 coupled to rail 70.

Thus, in circuit 40, transistor 401 is controlled by the same potential as that controlling transistor 10, that is, the potential of node 11. As a result, a current I7 flowing between the conduction terminals of transistor 401, in the present example a positive current I7 flowing from rail 70 to rail 60, is representative of the current Iout flowing through transistor 10. In other words, current I7 is a multiple of current Iout, current I7 being preferably smaller than current Iout, for example, at least 10 times smaller, for example, at least 50 times smaller, or even at least 100 times smaller than current Iout.

Circuit 40 further comprises a current mirror 405. Current mirror 405 is configured to generate current I4 from current I7. In other words, current mirror 405 is configured to generate current I4 so that it is representative of current I7, and thus of current Iout. Current4 is then a multiple of current I7, and is preferably equal to current I7.

A first branch of current mirror 405 (on the right-hand side in FIG. 3) is connected to node 403, so that current I7 flows through this first branch. In other words, the first branch of current mirror 405 is connected between node 403 and node 47, and thus between node 403 and rail 70. A second branch of current mirror 405 (on the left-hand side of FIG. 3) is connected to node 30, so that current I4 is supplied to node 30 by the second branch of current mirror 405. In other words, the second branch of current mirror 405 is connected between node 47 and node 43, and thus between rail 70 and node 30.

As an example, as shown in FIG. 3, the first and second branches of current mirror 405 each comprise a transistor, respectively 4051 and 4052. As an example, transistors 4051 and 4052 are MOS transistors, for example, PMOS transistors in the present example where currents I7 and I4 are positive. NMOS transistor 4051 has a conduction terminal, in the present example its drain, connected to node 403, NMOS transistor 4052 has a conduction terminal, in the present example, its drain, connected to node 30, the other conduction terminal, in the present example, the source, of each of transistors 4051 and 4052 being connected to rail 70. Further, the control terminal of transistor 4051 is connected to node 403 and to the control terminal of transistor 4052. Preferably, transistors 4051 and 4052 are identical or, in other words, have the same W/L ratio, currents I7 and I4 being then equal.

According to an embodiment, circuit 50 comprises a current mirror 501. Current mirror 501 is configured to generate current I6 from current I5. In other words, current mirror 501 is configured to generate current I6 so that it is representative of current I5. Current I6 then is a multiple of current I5. Preferably, current I6 is greater than or equal to 10 times current I5. Preferably, current I6 is smaller than or equal to 20 times the current.

A first branch of current mirror 501 (on the left-hand side of FIG. 3) is connected to node 51 of circuit 50, and thus to node 30, to receive current I5, so that current I5 flows through the first branch. In other words, the first branch of current mirror 501 is connected between nodes 51 and 55 of circuit 50 and thus between node 30 and rail 60. A second branch of current mirror 501 (on the right-hand side of FIG. 3) is connected to node 53 of circuit 50, and thus to terminal n of transistor 10, so that current I6 is drawn from terminal n by the second branch of current mirror 501. In other words, the second branch of current mirror 501 is connected between nodes 53 and 55 of circuit 50, and thus between rail 60 and terminal 11 of transistor 10.

As an example, as shown in FIG. 3, the first and second branches of current mirror 501 each comprise a transistor, respectively 5011 and 5012. As an example, transistors 5011 and 5012 are MOS transistors, for example, NMOS transistors in the present example where current mirror 501 is connected to rail 60. NMOS transistor 5011 has a conduction terminal, in the present example, its drain, connected to node 30, NMOS transistor 5012 has a conduction terminal, in the present example, its drain, connected to terminal 11, the other conduction terminal, in the present example, the source, of each of transistors 5011 and 5012 being connected to rail 60. Further, the control terminal of transistor 5011 is connected to node 30 and to the control terminal of transistor 5012. Preferably, the W/L ratio of transistor 5012 is greater than that of transistor 5011, for example, the W/L ratio of transistor 5012, is equal to k times that of transistor 5011, k being in the range from 10 to 20.

As an specific embodiment, transistors 203 and 201 have a same W/L ratio, transistors 2071 and 2072 have a same W/L ratio for example equal to that of transistors 201 and 203, transistors 4052 and 4051 have a same W/L ratio for example equal to that of transistors 203 and 201, transistors 5012 has a W/L ratio equal to k times the W/L ratio of transistor 5011, the W/L ratio of transistor 5011 being for example equal to that of transistors 201 and 203, transistor 10 has a W/L ratio equal to N times that of transistors 201 and 203, the W/L ratio of transistor 401 being for example equal to that of transistors 201 and 203. In the present example, in steady state, currents I1, I2, I3, and I6 are equal, current I5 is equal to current I6 divided by 15, and current I7 and I4 are equal to $(1+1/k)*I1$. Further, since transistors 401 and 10 have the same gate potential and the same source potential, current Iout is equal to $N*(1+1/k)*I1$. Current Iout is then effectively determined by the value of current I1. In other words, current Iout is equal to j time current I1, j being equal to $N*(1+1/k)$.

Preferably, factor k is selected to be sufficiently large, for example, greater than or equal to 10 so that current Iout is considered as being substantially equal to $N*I1$, so that, by selecting N equal to j, device 1 supplies a current Iout substantially equal to $j*Ii$. Further, preferably, factor k is selected to be sufficiently small, for example, smaller than or equal to 20, to avoid possible instabilities in device 1 which might occur if difference I5 between currents I2 and I4 was too amplified by circuit 50 and, more specifically, by the current mirror 501 of circuit 50.

In device 1 described in relation with FIGS. 1 to 3, each time a transistor has been described, it can be understood that this transistor can be implemented by using a single transistor or of a plurality of transistors connected in parallel. In particular, MOS transistor 10 may correspond to a single MOS transistor having a W/L ratio equal to N times that of MOS transistor 201. The MOS transistor 10 may also correspond to a plurality of MOS transistors connected in parallel, that is, all having same conduction terminals, for example, their sources, connected together, same other conduction terminals, for example, their drains, connected together, and their control terminals connected together. For example, transistor 10 may be implemented by means of N MOS transistors in parallel having a W/L ratio equal to that of transistor 201.

Further, although a flow direction has been selected here-above by convention for each current and it has been indicated that the current is drawn from a node or a terminal, or supplied to the node or terminal, for the selected flow direction, it could have chosen to invert the current flow direction selected by convention, and the current would then have been respectively supplied to the node terminal, or drawn from the node or terminal.

Various embodiments and variations have been described. It will be understood by those skilled in the art that certain feature of these various embodiments and variations may be combined, and other variations will occur to those skilled in the art. In particular, embodiments where current I1, I2, I3, I4, and Iout are positive for the flow directions selected for these currents have been described. It will be within the abilities of those skilled in the art to adapt these embodiments to the case where, while keeping the flow directions selected for the currents, the latter are all negative, for example, by replacing all the NMOS, respectively PMOS, transistors described in relation with FIG. 3, with PMOS, respectively NMOS transistors.

Further, although embodiments where the transistors are MOS transistors have been described, it will be within the abilities of those skilled in the art to adapt these embodiments to the case where the transistors are bipolar transistors.

Finally, the practical implementation of the described embodiments and variations is within the abilities of those skilled in the art based on the functional indications given here-above. In particular, it will be within the abilities of those skilled in the art to size the various described transistors so that device 1 operates as previously described, particularly so that, for a selected value j, current Iout is equal to j times current I1.

What is claimed is:

1. A device for generating a first current from a second current, the device comprising:
   an output transistor configured to generate the first current;
   a first circuit configured to generate a third current representative of the second current and to draw the third current from a first node of the device;
   a second circuit configured to generate a fourth current representative of the first current flowing through the output transistor and to supply the fourth current to the first node; and
   a third circuit coupled to the first node to receive a fifth current representative of a difference between the third and fourth currents, the third circuit being configured to generate a sixth current representative of the fifth current and to draw the sixth current from a control terminal of the output transistor, wherein the device is configured so that a variation of the second current causes a corresponding variation of the third and fourth currents, and so that the variation of the third current is faster than the variation of the fourth current.

2. The device of claim 1, configured so that the first current is equal to j times the second current, j being greater than or equal to 25.

3. The device of claim 2, wherein j is greater than or equal to 100.

4. The device of claim 1, wherein the third circuit is configured so that the sixth current is equal to k times the fifth current, k being in the range from 10 to 20.

5. The device of claim 1, wherein a current mirror of the first circuit comprises a first branch coupled to a second node configured to receive the second current, and a second branch coupled to the first node and configured to draw the third current from the first node.

6. The device of claim 1, wherein the first circuit is further configured to supply a seventh current to the control terminal of the output transistor, the seventh current being determined by the second current.

7. The device of claim 6, wherein:
   a first transistor of the first circuit comprises a first conduction terminal coupled to the control terminal of the output transistor and is disconnected from the first node; and
   a second transistor of the first circuit comprises a first conduction terminal coupled to a first branch of a current mirror of the first circuit, and a second conduction terminal and a control terminal coupled to a second node configured to receive the second current and to a control terminal of the first transistor.

8. The device of claim 1, wherein:
   a first transistor of the second circuit comprises a control terminal coupled to the control terminal of the output transistor; and
   a current mirror of the second circuit comprises a first branch coupled to a first conduction terminal of the first transistor of the second circuit and a second branch coupled to the first node.

9. The device of claim 1, wherein a current mirror of the third circuit comprises a first branch coupled to the first node and configured to receive the fifth current, and a second branch coupled to the control terminal of the output transistor and configured to draw the sixth current from the control terminal of the output transistor.

10. The device of claim 1, wherein the first, second, third, and fourth currents are all positive or all negative.

11. The device of claim 1, further comprising a current source configured to supply the second current.

12. The device of claim 1, wherein each of the first and second circuits is coupled between a first rail and a second rail, the first rail configured to receive a first voltage, the second rail configured to receive a second voltage, wherein the third circuit is coupled to the second rail and to the output transistor, the output transistor having a conduction terminal coupled to the second rail.

13. The device of claim 12, further comprising a current source coupled between the first rail and the first circuit.

14. The device of claim 12, wherein the first voltage is greater than the second voltage.

15. The device of claim 12, wherein the second voltage is a reference voltage of the device.

16. The device of claim 1, wherein the second circuit comprises a first transistor having a control terminal coupled to the control terminal of the output transistor, and wherein the second circuit is configured to generate the fourth current using the first transistor.

17. A circuit comprising:
   an output terminal configured to be coupled to a control terminal of an output transistor;
   a first circuit configured to receive a first current and to generate a second current based on the first current and to draw the second current from a first node;
   a second circuit configured to generate a third current representative of an output current flowing through the output transistor and to supply the third current to the first node; and
   a third circuit coupled to the first node to receive a fourth current representative of a difference between the second and third currents, the third circuit being configured to generate a fifth current representative of the fourth current and to draw the fifth current from the output terminal, wherein a variation of the first current is configured to cause a corresponding variation of the second and third currents, and so that the variation of the second current is faster than the variation of the third current.

18. A method comprising:
   receiving an input current;
   generating an output current based on the input current with an output transistor by mirroring the input current into a first current using a first current mirror that is coupled to a control terminal of the output transistor; and
   mirroring the input current into a second current using a second current mirror having a first branch configured to receive the input current and a second branch coupled to an intermediate node, the intermediate node being coupled to first branch of a third current mirror and to a first branch of a fourth current mirror, the fourth current mirror having a second branch coupled to the control terminal of the output transistor, the third current mirror having a second branch coupled to a first transistor having a control terminal coupled to the control terminal of the output transistor.

19. The method of claim 18, wherein transistors of the first current mirror comprises n-type transistors, the second current mirror comprises n-type transistors, the third current mirror comprises p-type transistors, and the fourth current mirror comprises n-type transistors.

20. A circuit comprising:
an input terminal configured to receive an input current;
an output terminal configured to be coupled to a control terminal of an output transistor;
a first current mirror having a first branch coupled to the input terminal and a second branch coupled to the output terminal;
a second current mirror having a first branch coupled to the first branch of the first current mirror and a second branch coupled to an intermediate node;
a third current mirror having a first branch coupled to the intermediate node;
a fourth current mirror having a first branch coupled to the intermediate node, and a second branch coupled to the output terminal; and
a first transistor having a current path coupled to a second branch of the third current mirror and a control terminal coupled to the output terminal.

21. The circuit of claim 20, wherein transistors of the first and second current mirrors are of the same type.

* * * * *

UNITED STATES PATENT AND TRADEMARK OFFICE
CERTIFICATE OF CORRECTION

| | |
|---|---|
| PATENT NO. | : 11,150,682 B2 |
| APPLICATION NO. | : 17/085493 |
| DATED | : October 19, 2021 |
| INVENTOR(S) | : Kuno Lenz |

It is certified that error appears in the above-identified patent and that said Letters Patent is hereby corrected as shown below:

On the Title Page

Item (71) Applicant, delete "STMICROELECTRONICS (TOURS) SAS, Tours (FR)" and insert --STMICROELECTRONICS (ALPS) SAS, Grenoble (FR)--.

Item (73) Assignee, delete "STMICROELECTRONICS (TOURS) SAS, Tours (FR)" and insert --STMICROELECTRONICS (ALPS) SAS, Grenoble (FR)--.

Signed and Sealed this
Fifth Day of December, 2023

*Katherine Kelly Vidal*

Katherine Kelly Vidal
*Director of the United States Patent and Trademark Office*